Figure 1:
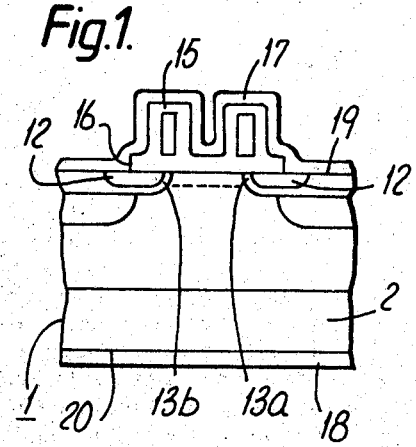

United States Patent [19]

Coe

[11] Patent Number: 4,466,175

[45] Date of Patent: Aug. 21, 1984

[54] MANUFACTURE OF VERTICAL INSULATED GATE FIELD EFFECT TRANSISTORS

[75] Inventor: David J. Coe, East Grinstead, England

[73] Assignee: U.S. Philips Corporation, New York, N.Y.

[21] Appl. No.: 387,122

[22] Filed: Jun. 10, 1982

[30] Foreign Application Priority Data

Jun. 17, 1981 [GB] United Kingdom ............... 8118595

[51] Int. Cl.³ ........................................ H01L 21/265
[52] U.S. Cl. .................................. 29/571; 29/576 B; 29/578; 29/580; 148/187; 148/190
[58] Field of Search ............. 29/571, 578, 580, 576 B; 148/187, 190

[56] References Cited

U.S. PATENT DOCUMENTS

| | | | |
|---|---|---|---|
| 3,919,007 | 11/1975 | Tarui et al. | 148/190 X |
| 3,923,553 | 12/1975 | Hayashi et al. | 29/571 X |
| 4,272,881 | 6/1981 | Angle | 29/571 |
| 4,287,660 | 9/1981 | Nicholas | 29/571 |
| 4,375,717 | 3/1983 | Tonnel | 29/571 |

Primary Examiner—G. Ozaki
Attorney, Agent, or Firm—Paul R. Miller

[57] ABSTRACT

A vertical insulated gate field effect transistor is made by providing a polycrystalline semiconductor layer on an insulating layer at a surface of an n-type semiconductor body, and thereafter forming gates of the IGFET by laterally diffusing a p-type impurity into the polycrystalline semiconductor layer below two opposite edges of a masking layer. A p-type zone and an n-type source zone are then formed at the surface of the semiconductor body by introducing the relevant impurities in the presence of the masking layer, and then by laterally diffusing these impurities below the gate with the p-type impurities for the p-type zone diffusing laterally farther beneath the gate than the n-type impurities of the source zone. The lateral extent of the source zone, the p-type zone, and the gates can all be predetermined in relation to the same edge of the masking layer which enables improved gate-channel alignment, and so minimizes Miller capacitance of the IGFET.

12 Claims, 9 Drawing Figures

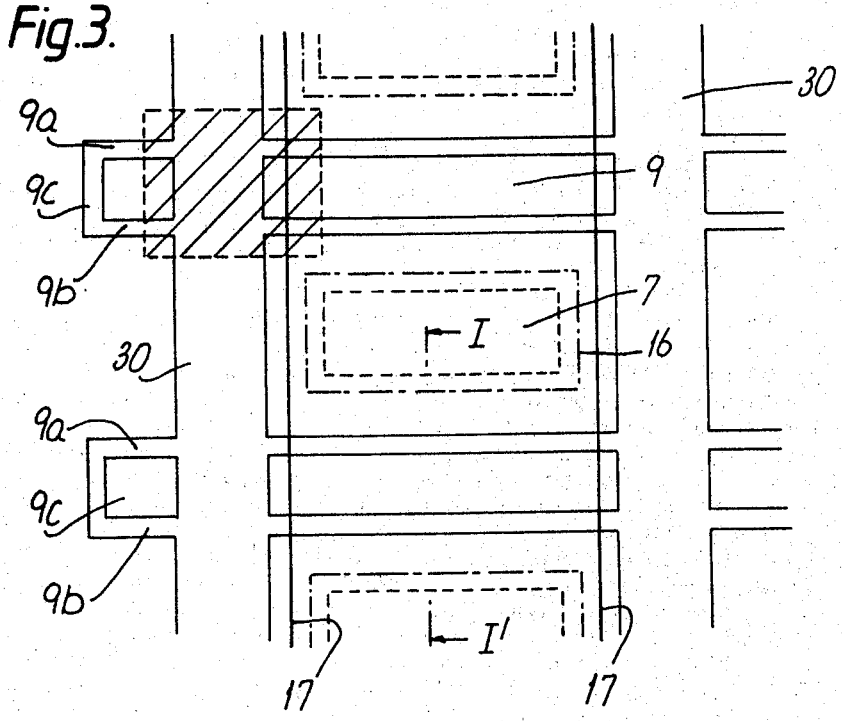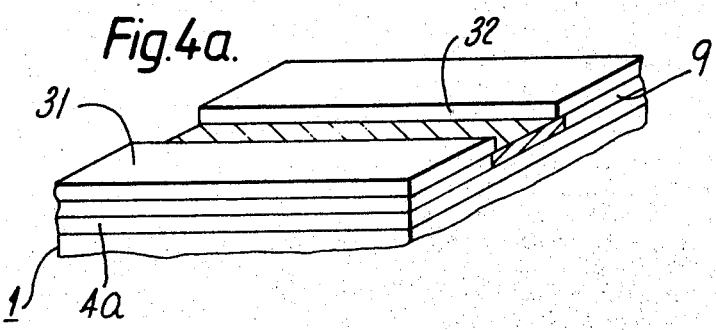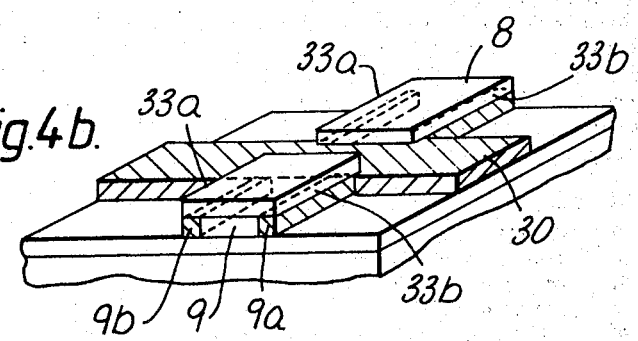

MANUFACTURE OF VERTICAL INSULATED GATE FIELD EFFECT TRANSISTORS

This invention relates to a method of manufacturing an insulated gate field effect transistor (often abbreviated to IGFET) having a vertical structure and further relates to an IGFET manufactured by such a method.

In the present application an IGFET with a "vertical" structure is one whose source and drain regions respectively adjoin opposite major surfaces of the semiconductor body in which they are formed.

The invention is particularly, although not exclusively, concerned with the manufacture of a so-called vertical D-MOS transistor. A D-MOS transistor (hereinafter abbreviated to D-MOST) is an IGFET with an accurately defined channel length, the channel being formed by double diffusion of different impurities into the semiconductor body. D-MOSTs can be made with accurately determined channel lengths even for short channel devices. This is advantageous because, within certain limits, the gain and speed of operation of an IGFET increases as its channel length decreases which means that D-MOSTs are particularly suited for high frequency power applications.

A vertical D-MOST can be manufactured as follows. A layer of relatively low resistivity polycrystalline silicon is provided on an oxide layer which is present on an n-type region of a semiconductor body. A masking layer is used to mask a part of the polycrystalline silicon and unmasked parts are removed by etching. The whole of the remaining portion of the polycrystalline layer forms the gate of the transistor. A p-type zone and the n-type source zone are then formed on each side of the gate by introducing impurities characteristic of the p and n types respectively in the presence of the masking layer and then diffusing the impurities laterally below the gate, the p-type zone having a lower doping concentration and being diffused further than the source zone. The difference between the diffusion distances of the two impurity types defines the length of the channel of the transistor. The gate overlies the full channel length, but it also overlaps the whole part of the n-type region at the surface of the semiconductor body between the p-type zones. It is this overlap which is responsible for field relief at the corners of the p-type zone, and also for current spreading by any gate-induced accumulation layer which may be present, but unfortunately it is also this overlap which presents the significant drawback that a D-MOST made in this known manner suffers from having a considerable drain-gate feedback capacitance (i.e. "Miller capacitance"), particularly at low drain bias.

According to the present invention a method of manufacturing an insulated gate field effect transistor comprising a semiconductor body and having source and drain zones respectively adjoining opposite major surfaces of the body, the method including the steps of providing a layer of polycrystalline semiconductor material on an insulating layer which is present on a first conductivity type region of the body, forming a masking layer on the polycrystalline layer, removing the unmasked parts of the polycrystalline layer, the gate of the transistor being formed from the masked part of the polycrystalline layer, introducing into the region impurities characteristic of the first and second conductivity types to form the source zone and a zone of the second conductivity type, and laterally diffusing the impurity characteristic of the second conductivity type below the masked part of the polycrystalline layer to a predetermined distance from an edge of the masking layer, is characterized in that the polycrystalline layer initially has a relatively high resistivity and the gate is a relatively low resistivity conductive strip of the polycrystalline layer, which strip is defined by laterally diffusing a doping element into the masked part of the polycrystalline layer, the doping element being diffused laterally to a predetermined distance from the edge of the masking layer.

The use of lateral diffusion to define the gate and the second conductivity type zone allows a high degree of alignment between the gate and the channel of the transistor so that gate-drain overlap, and hence the Miller capacitance of the IGFET, can be minimized. This is achieved because the lateral extent of the first conductivity type source zone, the second conductivity type zone, and the gate can be predetermined in relation to the same edge of the masking layer. It should be noted that the channel of the transistor is that part of the second conductivity type zone which is not overdoped by impurities of the first conductivity type and which lies below the area of the gate.

Before defining the conductive strip which forms the gate unmasked parts of the polycrystalline layer may be removed such that adjacent the edge of the masking layer an edge of the polycrystalline layer is exposed substantially throughout the thickness of the polycrystalline layer. In this case the conductive strip (i.e., the gate) is defined by laterally diffusing a doping element into the masked part of the polycrystalline layer via the exposed edge of the polycrystalline layer.

To assist current-spreading it may be desirable to include a region of the first conductivity type at the surface of the semiconductor body on the side of the channel remote from the source. For this purpose the undiffused portion of the polycrystalline layer is removed using a selective etching treatment after removal of the masking layer. The impurity characteristic of the first conductivity type can then be introduced into the surface of the semiconductor body at areas not masked by the gate.

To provide field relief at the drain corners of the channel it can be arranged that an electrode which contacts the source zone of the transistor extends on an insulating layer on the drain side of the channel.

Embodiments of the invention will now be described, by way of example, with reference to the accompanying drawings, in which:

FIG. 1 is a sectional view of part of an IGFET manufactured by a method in accordance with the invention, taken on the line I–I' of FIG. 3, FIGS. 2a to 2e show in similar cross-section to that of FIG. 1 various stages of a method of manufacturing an IGFET in accordance with the invention, FIG. 3 is a schematic plan view of a gate configuration for part of an IGFET manufactured by a method in accordance with the invention, and FIGS. 4a and 4b show isometric views of the hatched part of the IGFET of FIG. 3.

For the sake of clarity the Figures are not drawn to scale and the cross-sectional views are not hatched.

The IGFET which is manufactured by the following method is, in fact, a vertical D-MOST. It can be seen from FIG. 1 that the source and drain regions 12 and 2 respectively adjoin the opposite major surfaces 19 and 20 of the semiconductor body 1. Because the transistor has this configuration current flow occurs between these opposite major surfaces which explains why the transistor is described as being "vertical". The other features of the transistor will not be described in further detail at this point as they will become apparent from the following method.

Figure 2A:
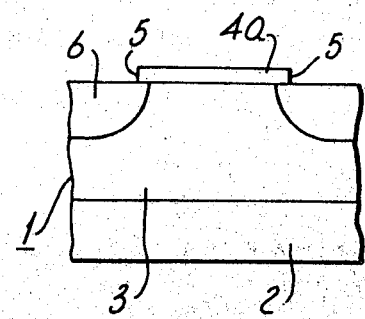
Figure 2B:
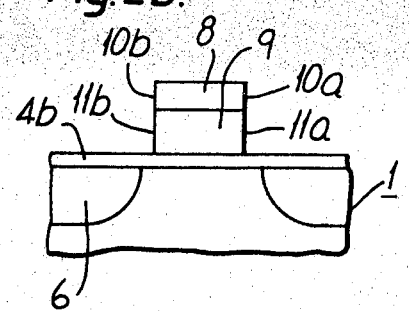

Referring now to FIG. 2a, a semiconductor body 1 comprises an n+ substrate 2 having a resistivity of for example $10^{-3}$ Ohm cm and a thickness of 250 micrometers. A more highly resistive n-type region 3 is epitaxially grown on the substrate 2. Region 3 may have a resistivity of 40 Ohm cm and a thickness of 50 micrometers. After thermally growing an oxide layer 4a (using any conventional method) on the free surface of region 3 a window 5 is formed using standard photolithographic and etching techniques. The oxide layer 4a is sufficiently thick, for example 0.4 micrometer, to mask the underlying region 3 against impurity diffusion. The next step is to diffuse boron into region 3 using, for example, boron deposition for 30 minutes at 1,000° C. followed by drive-in for 3 hours at 1,100° C. Thus the p+ zones 6 are formed, these zones now extending to a depth of, for example, 3 micrometers and also extending laterally below the oxide layer 4a which is then stripped before growing a further oxide layer 4b to a thickness of, for example, 0.1 micrometer over the whole upper surface.

A polycrystalline silicon layer having a relatively high resistivity of, for example, $10^5$ Ohm cm is then deposited over the upper surface of the oxide layer 4b. After this, a silicon nitride layer is deposited on the polycrystalline layer and a silicon nitride masking layer 8 is formed using standard photolithography and etching, the unwanted parts of the nitride layer being removed by etching with hot phosphoric acid (see FIG. 2b). The polycrystalline silicon layer is then etched in the presence of the masking layer 8 using Catechol (i.e. a solution of pyrocatechol in ethylenediamine and water) to remove unmasked parts and leave portion 9. Thus, adjacent the edges 10a and 10b of the masking layer 8, the edges 11a, 11b of the polycrystalline layer are exposed throughout the thickness of the polycrystalline layer.

Figure 2C:
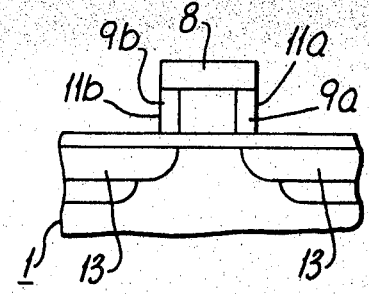
Figure 2D:
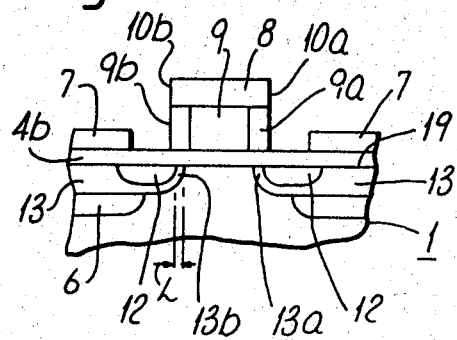

Referring to FIG. 2c, the next stage is to laterally diffuse a doping element such as boron into the remaining portion of the polycrystalline layer 9 via the exposed edges 11a and 11b. The boron may be introduced by diffusion from a boron nitride source, the diffusion conditions depending on the morphology of the polycrystalline layer. For example, when the polycrystalline layer is deposited by chemical vapour phase deposition at atmospheric pressure and 770° C. the diffusion may be carried out at 1025° C. for 45 minutes. In this way the relatively low resistivity strips 9a, 9b are formed. These strips, which may have lateral dimensions of 1 micrometer and a resistivity of 40 Ohms per square, will form the gate of the transistor. By knowing the lateral diffusion rate of boron in polycrystalline silicon, the diffusion conditions can be calculated which give the desired amount of lateral diffusion so that the boron can be diffused to a predetermined distance from the edges of the masking layer 8. The two strips 9a and 9b run in parallel along the full length of the original polycrystalline layer 9 which may have been provided in a rectangular mesh configuration as shown in FIG. 3. As will become evident from the later discussion on the channel of the transistor, it is the lateral dimension (as shown in FIG. 2c) of the low-resistivity strips which is referred to as the gate length. Because lateral diffusion occurs at all the exposed edges of the polycrystalline layer then, unless preventative measures are taken the strips are formed in closed geometry, that is to say as a continuous loop, which loop is, in effect, the entire periphery of the original polycrystalline layer 9.

The next stage involves the implantation of boron ions using, for example, a dose of $10^{13}$ cm$^{-2}$ and an energy of 150 keV followed by a drive-in at 1,050° C. for 30 minutes. Thus the p-type zone 13 is formed. Next a photoresist masking layer 7 is formed in known manner, the thickness of this layer being such that it masks the underlying region 3 from the subsequent ion implantation which is carried out using phosphorus ions with a dose of $10^{15}$ cm$^{-2}$ and an energy of 50 keV (see FIG. 2d). An annealing treatment is then carried out for 10 minutes at 1,000° C. With the conditions mentioned here the impurities of the p-type zone 13 diffuse laterally further than those of the source zone 12. By knowing the lateral diffusion rates of boron and phosphorus in silicon the difference L in the amount of lateral diffusion between the two zones 12 and 13 can be calculated. L is, in fact, the channel length, the channel of the transistor being that part 13a, 13b of zone 13 which is not overdoped by zone 12 and which lies below the area of the gate 9a, 9b respectively.

With the conditions specified, L (the channel length) is approximately 0.7 micrometer. In comparison the gate length is 1 micrometer. Of importance is the fact that these lengths are determined from the same reference point, i.e., the edge of the masking layer. Thus, the gate is aligned with the channel with minimum of gate-drain overlap. Clearly by knowing the lateral diffusion rates of the relevant impurities in a semiconductor material the zones 12 and 13 and the gate 9a, 9b can be diffused laterally to a predetermined distance from the edge of the masking layer 8 so that the gate can be aligned with the channel using different conditions from those specified above or even by using a different semiconductor body and different doping impurities.

Figure 2E:
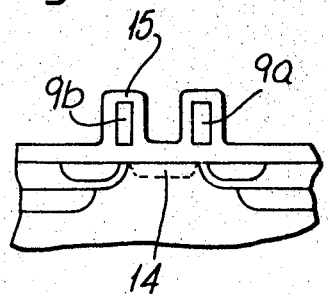

Next, the masking layer 8 is removed using hot phosphoric acid, followed by the removal of the undiffused polycrystalline silicon 9 using Catechol (see FIG. 2e). The polycrystalline silicon of portions 9a and 9b is then oxidized by heating at 1,000° C. for 10 minutes in wet oxygen to form oxide layer 15. Typically layer 15 is 0.05 micrometer thick. A further ion implant is then carried out using a dose of $10^{12}$ phosphorus ions cm$^{-3}$ at an energy of 120 keV. Thus the n-zone 14 is formed between the two parts of the channel 13a, 13b. During this implant the gate 9a, 9b masks the underlying channel against the phosphorus ions. The zone 14 is provided to assist current spreading and reduce pinch-off in the region between zones 13. The chosen dosage involves a compromise between increased current spreading and reduced pinch-off on the one hand and a decrease in the breakdown voltage on the other hand.

Windows 16 are then opened in the oxide layer 15 (see FIG. 1) and an aluminium layer 17 is deposited in known manner on the surface of layer 15 to provide electrical contact to source zone 12 and zone 13. The aluminum layer 17 is also deposited on the oxide layer 15 between the parts 13a and 13b of the channel where it acts as a field plate to cause field-relief at the drain corner of the channel. The drain of the transistor is constituted by the n-type substrate 2 and an electrode 18 is provided on the free surface of the substrate 2 to form the drain contact. The electrode may be, for example, gold-antimony which is deposited in known manner.

FIGS. 1 and 2 show only part of a D-MOST. As mentioned previously the polycrystalline layer may be provided in a rectangular mesh configuration over the surface of the semiconductor body as shown in FIG. 3. Thus the gate will, for its major part be in the form of parallel strips 9a, 9b joined in pairs at their ends 9c so that the gate extends along the full periphery of the polycrystalline layer 9. Thus the channel width (and also the gate width) is equivalent to the full peripheral dimension of the polycrystalline layer 9.

In order to avoid undue complexity of the Figures only the part of the transistor taken on the line I—I' of FIG. 3 is shown in FIG. 1.

To facilitate comparison with the previous sectional views FIG. 3 shows the photoresist masking layer 7 (cf. FIG. 2d), the window 16 in the oxide layer 15 (cf. FIG. 1) and the source metallization 17 (cf. FIG. 1). In FIG. 3 the photoresist masking layer 7 covers the area enclosed by the broken line, the window 16 is depicted by the chain line, and the source metallization 17 covers the area between the two parallel, vertical solid lines.

From FIG. 3 it can be seen that a complete IGFET comprises a plurality of pairs of substantially parallel polycrystalline strips 9a, 9b and that adjacent strips are connected electrically by bus-bars 30 which are also formed from low resistivity polycrystalline silicon. A method of forming such a bus-bar will now be described with reference to FIGS. 4a and 4b which are isometric views of the upper portion of the hatched part of the IGFET of FIG. 3.

After depositing the polycrystalline silicon layer 9 (as described with reference to FIG. 2b above) a layer 31 of silicon nitride is deposited on the whole upper surface after which a window 32 is opened using conventional photolithographic and etching techniques. Next, boron is introduced into the exposed polycrystalline silicon layer 9 using, for example, diffusion from a boron nitride source for 30 minutes at 1,000° C. (see FIG. 4a). The relatively low resistivity bar of polycrystalline material thus formed is indicated by hatching in FIGS. 4a and 4b. Further windows 33a and 33b are then opened in the nitride layer 31 and the exposed polycrystalline silicon is etched using Catechol which does not etch the relatively low resistivity bar 30 of polycrystalline silicon. The remaining parts of the silicon nitride layer constitute masking layer 8 (see FIGS. 4b and 2b). The low resistivity strips 9a, 9b (also hatched in FIG. 4b) are then formed by lateral diffusion as described above. If desired, the bus-bars 30 can be overlaid with metal strips, for example of aluminium, to reduce the series resistance of these interconnections. In addition, to minimise parasitic input capacitance the deep p+ zones may be extended beneath the bus-bars 30 and be separated therefrom by a thick field oxide.

It will be appreciated that many modifications may be made within the scope of the present invention. For example, it is not necessary that the source zone is deliberately laterally diffused below the gate. Also, the implant to form the source zone 12 and the implant to form the current-spreading zone 14 can be carried out simultaneously. Moreover, it is not necessary that zone 13 is diffused only to the extent that its junction with the n-region 3 terminates below the gate. On the contrary zone 13 may initially extend beyond the gate as long as n-type zone 14 is sufficiently highly doped to overdope zone 13 so that, after formation of zone 14, the channel of the transistor terminates directly below the edge of the gate.

In another modification of the described embodiment the unmasked parts of the polycrystalline layer are not removed before defining the gate by lateral diffusion into the polycrystalline layer. Instead two diffusions are carried out, the first being a lateral diffusion of, for example boron and the second of an impurity characteristic of the opposite conductivity type, such as phosphorus. The phosphorus has a higher concentration than the boron, but is diffused laterally beneath the masking layer to a smaller distance. After removal of the masking layer the n-type part of the polycrystalline layer and the undiffused part can be removed by the known technique of selective etching using, for example, Catechol. After removal of the n-type part the method can then be continued as described above. This modified embodiment is particularly advantageous when a relatively wide gate is to be formed because, during the relatively long diffusion time needed to define the gate, the polycrystalline layer acts as a mask to prevent the undesirable conversion of the underlying oxide into borosilicate glass.

In a further modification of the described embodiment the undiffused portion of the polycrystalline layer 9 is not removed. Being highly resistive this portion provides effective decoupling between the highly doped gate and the drain region lying between regions 13a and 13b. On the other hand the undiffused portion can be sufficiently conductive to provide the previously mentioned field relief.

The series resistance of the selectively etched polycrystalline silicon gates can be reduced by conversion to a refractory metal silicide using known techniques for example by removing the masking layer from the polycrystalline silicon, covering the surface with evaporated platinum, heat treating, and then removing the excess metal in aqua regia.

Of course the invention is also applicable to IGFETs made of a semiconductor material other than silicon and using dopant impurities other than those mentioned above. Also, the conductivity types of all the various regions and zones of the IGFET can be reversed without departing from the scope of the invention.

I claim:

1. A method of manufacturing an insulated gate field effect transistor including a semiconductor body having source and drain zones respectively adjoining opposite major surfaces of said body comprising the steps of
providing a semiconductor body of a first conductivity type with a first insulating layer at portions of a first major surface of said semiconductor body,
forming regions of a second conductivity type in said first major surface at portions free of said first insulating layer,
removing said first insulating layer and forming a second insulating layer on said first major surface,
forming a polycrystalline semiconductor layer on said second insulating layer,
forming a masking layer on said polycrystalline layer between said regions of said second conductivity type,
removing unmasked portions of said polycrystalline layer,
forming gates of the transistor at masked portions of said polycrystalline layer by laterally diffusing a doping element of said second conductivity type into said polycrystalline layer beneath two opposite edges of said masking layer to a predetermined distance, wherein said polycrystalline layer initially has a relatively high resistivity and said gates include pairs of relatively low resistivity conductive strips portions of said laterally diffused portions of said polycrystalline layer, introducing into said semiconductor body impurities of said first conductivity type to form source zones and impurities of said second conductivity type to form zones of said second conductivity type at least partially below said gates, said impurities of said second conductivity type being introduced in the presence of said masking layer, and said zones of said second conductivity type overlying said regions of second conductivity type, said zones having a lower doping then said regions, removing said masking layer and said polycrystalline layer free of said gates, forming an insulating layer over said gates, forming a first electrically conductive layer in contact with said source zones, and forming a second electrically conductive layer at a second major surface of said semiconductor body in contact with a drain zone of said semiconductor body.

2. A method according to claim 1, wherein an impurity characteristic of said first conductivity type is introduced into said semiconductor body at said first major surface between said zones of said second conductivity type, said first conductivity type impurity being at areas free of said gates.

3. A method according to claim 2, wherein said source zones are formed prior to removing said masking layer.

4. A method according to claim 3, wherein said zones of said second conductivity type extend below said gates from said two opposite edges to an extent constituting channels of the transistor with the edges of said source zones, said channels being precisely defined below said gates.

5. A method according to claim 4, wherein said gates have gate lengths greater than said channels.

6. A method according to claim 4, wherein said zones of said second conductivity type extend beyond said gates, and said first conductivity type impurity characteristic at areas free of said gates is sufficiently highly doped so that said channels terminate directly below edges of said gates.

7. A method according to claim 2, wherein said zones of said second conductivity type extend below said gates from said two opposite edges to an extent constituting channels of the transistor with the edges of said source zones, said channels being precisely defined below said gates.

8. A method according to claim 7, wherein said gates have gate lengths greater than said channels.

9. A method according to claim 7, wherein said zones of said second conductivity type extend beyond said gates, and said first conductivity type impurity characteristic at areas free of said gates is sufficiently highly doped so that said channels terminate directly below edges of said gates.

10. A method according to claim 1, wherein said first electrically conductive layer extends on said insulating layer over said gates.

11. A method according to claim 1, wherein a relatively low resistivity polycrystalline bar is formed to electrically connect said gates.

12. A method according to claim 1, wherein said drain zone is formed of a more highly doped region of said first conductivity type at said second major surface of said semiconductor body.

* * * * *